(12) United States Patent
Grueter et al.

(10) Patent No.: US 9,233,389 B2
(45) Date of Patent: Jan. 12, 2016

(54) DEVICE FOR DISPENSING ADHESIVE ON A SUBSTRATE

(71) Applicant: Besi Switzerland AG, Cham (CH)

(72) Inventors: Ruedi Grueter, Buttisholz (CH); Christof Koster, Allenwinden (CH); Paul Andreas Stadler, Rotkreuz (CH)

(73) Assignee: Besi Switzerland AG, Cham (CH)

(*) Notice: Subject to any disclaimer, the term of this patent is extended or adjusted under 35 U.S.C. 154(b) by 0 days.

(21) Appl. No.: 14/253,625

(22) Filed: Apr. 15, 2014

(65) Prior Publication Data

US 2014/0305372 A1  Oct. 16, 2014

(30) Foreign Application Priority Data

Apr. 15, 2013 (CH) .......................................... 777/13

(51) Int. Cl.
| | |
|---|---|
| *B05B 7/06* | (2006.01) |
| *B05B 3/00* | (2006.01) |
| *B05C 5/02* | (2006.01) |
| *H05K 13/04* | (2006.01) |
| *H01L 23/00* | (2006.01) |
| *H01L 21/67* | (2006.01) |

(52) U.S. Cl.
CPC ............... *B05C 5/027* (2013.01); *B05C 5/0216* (2013.01); *B05C 5/0279* (2013.01); *B05C 5/0295* (2013.01); *H01L 24/743* (2013.01); *H05K 13/0469* (2013.01); *H01L 21/6715* (2013.01)

(58) Field of Classification Search
CPC ................................ B05C 5/0216; B05B 3/00
USPC .......... 118/300, 313–315, 323, 321; 156/578; 427/256
See application file for complete search history.

(56) References Cited

U.S. PATENT DOCUMENTS

| | | | | |
|---|---|---|---|---|
| 3,584,571 | A | * | 6/1971 | Schmoll .......................... 347/54 |
| 3,810,779 | A | * | 5/1974 | Pickett et al. ......... B01L 3/0203 |
| | | | | 118/401 |
| 4,715,112 | A | | 12/1987 | Jackson et al. |
| 6,129,040 | A | | 10/2000 | Viggiano et al. |
| 7,977,231 | B1 | | 7/2011 | Lam et al. |
| 2003/0044534 | A1 | | 3/2003 | Lau et al. |
| 2010/0310778 | A1 | * | 12/2010 | Shioi et al. ..................... 427/424 |

FOREIGN PATENT DOCUMENTS

| | | |
|---|---|---|
| CH | 705 475 | 3/2013 |
| EP | 1 328 009 | 7/2003 |
| EP | 1 432 013 | 6/2004 |
| EP | 1 891 865 | 2/2008 |
| GB | 2 278 991 | 12/1994 |

* cited by examiner

*Primary Examiner* — Yewebdar Tadesse
(74) *Attorney, Agent, or Firm* — Nixon Peabody LLP

(57) ABSTRACT

A device for dispensing adhesive on a substrate comprises a writing head with a first dispensing nozzle and at least one second dispensing nozzle. The device can be operated in two operating modes and is configured to perform the following steps for the change from the one operating mode to the other operating mode: —lifting of the writing head, retracting or extending a pin, and lowering of the writing head to a predetermined working altitude, wherein the tips of the dispensing nozzles reach a substantially similar altitude above the substrate in the retracted state of the pin, and wherein the tip of the at least one second dispensing nozzle reaches a higher altitude above the substrate than the tip of the first dispensing nozzle in the extended state of the pin.

2 Claims, 4 Drawing Sheets

DEVICE FOR DISPENSING ADHESIVE ON A SUBSTRATE

PRIORITY CLAIM

Applicant hereby claims foreign priority under 35 U.S.C §119 from Swiss Patent Application No. 00777/13 filed Apr. 15, 2013, the disclosure of which is herein incorporated by reference.

FIELD OF THE INVENTION

The invention relates to a device for dispensing adhesive on a substrate.

BACKGROUND OF THE INVENTION

Such devices are used as a dispensing station in a semiconductor mounting apparatus in order to apply adhesive such as epoxy to the chip mounting surfaces of a substrate. Subsequently, the substrates are transported to a bonding station where the semiconductor chips are placed. From U.S. Pat. No. 6,129,040 and EP 1432013 devices for the application of adhesive to a substrate are known, which contain a writing head with a dispensing nozzle which is movable in three spatial directions X, Y and Z. From CH 705475 a method is known which uses a camera for recognizing the position of the substrate location prior to the application of the adhesive and for the quality control after the application of the adhesive, which coordinates the application of the adhesive with the movement of the writing head in order to obtain high throughput. From US 2003044534 a device is known which comprises a writing head with a dispensing nozzle with two outlet openings. From U.S. Pat. No. 7,977,231 a device is known which comprises two dispensing nozzles which are independently movable from each other in at least one direction. Furthermore, semiconductor mounting apparatus are known which contain two complete dispensing stations with one dispensing nozzle each.

Dispensing stations with only one dispensing nozzle come with the disadvantage that they are often slower than the following bonding station, because the waiting time which is required until the adhesive applied to the substrate has detached from the dispensing nozzle limits the throughput. The dispensing stations known from the state of the art with two dispensing nozzles come with various disadvantages, namely lack of flexibility and/or high constructional complexity.

SUMMARY OF THE INVENTION

The invention is based on the object of developing a device for the application of adhesive which allows applying adhesive in a simple way and at high speed to substrates with an uneven number of substrate places per row or column and easily applying the adhesive a second time to a substrate when a dispensing error is recognized.

A device in accordance with the invention for applying adhesive to a substrate comprises a writing head that is movable in three spatial directions. A first dispensing nozzle and at least one second dispensing nozzle can be fixed in such a way to the writing head that the tip of the first dispensing nozzle is fixed and the tip of the at least one second dispensing nozzle is movable in a direction extending substantially perpendicularly to a surface of the substrate. An actuator with a pin is fastened to the writing head. The device can be operated in two operating modes and is set up to perform the following steps for the change from the one operating mode into the other operating mode:
  lifting of the writing head;
  extending or retracting the pin, and
  lowering the writing head to a predetermined working altitude, wherein in the retracted state of the pin the tips of the dispensing nozzles reach a substantially similar altitude above the substrate, and wherein in the extended state of the pin the tip of the at least one second dispensing nozzle reaches a higher altitude above the substrate than the tip of the first dispensing nozzle.

The device preferably comprises four struts which are connected to each other by flexure hinges. The at least one second dispensing nozzle can be fixed to one of said struts. The flexure hinges allow a movement of the tip of the at least one second dispensing nozzle in the aforementioned direction, which extends substantially perpendicularly to the surface of the substrate. A guide prevents a movement of the strut to which the at least one second dispensing nozzle is fixed in other directions.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not to scale. In the drawings.

DETAILED DESCRIPTION OF THE INVENTION

Figure 1:
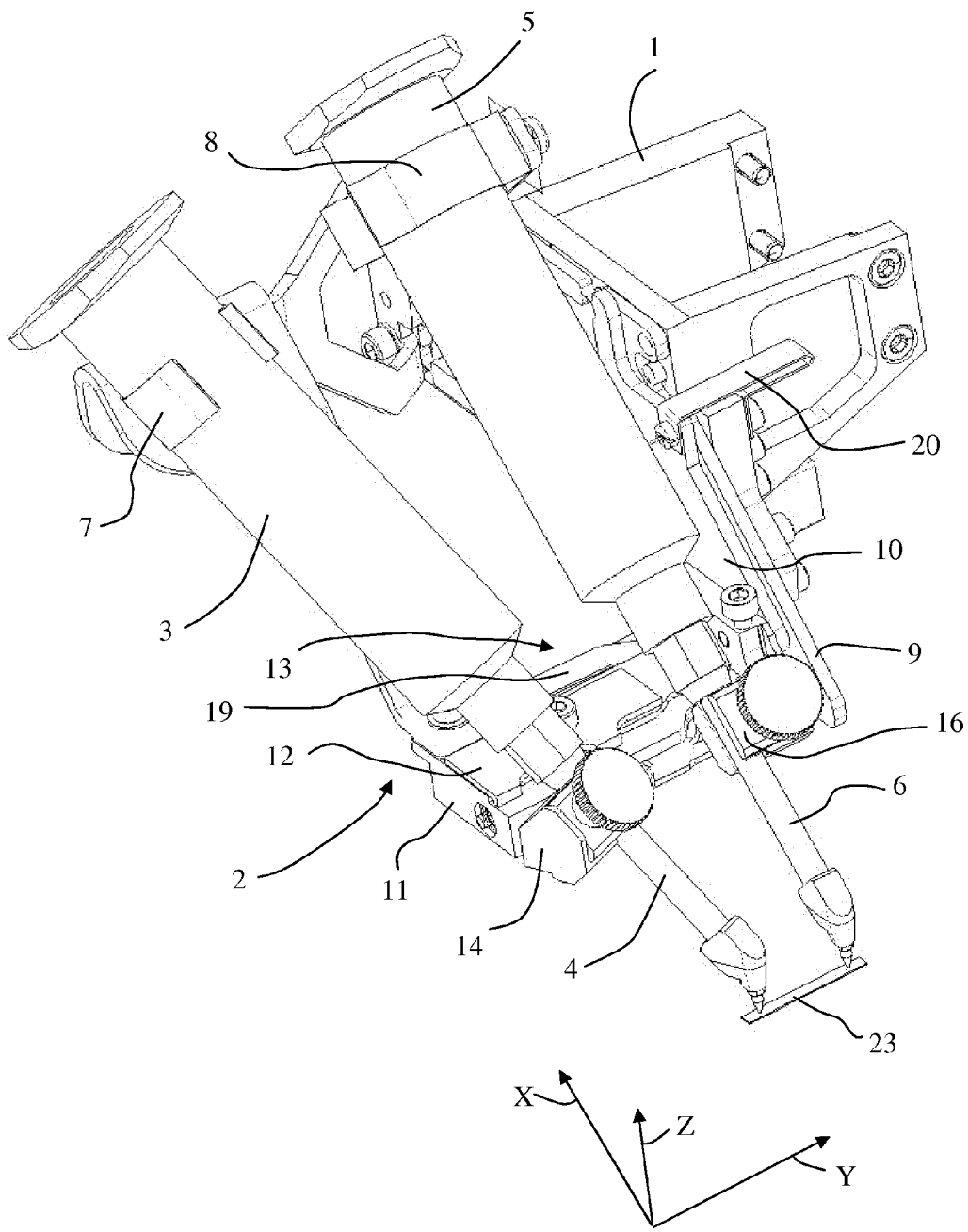
FIG. 1 shows a perspective view of parts of a device in accordance with the invention for applying adhesive to a substrate.
Figure 2:
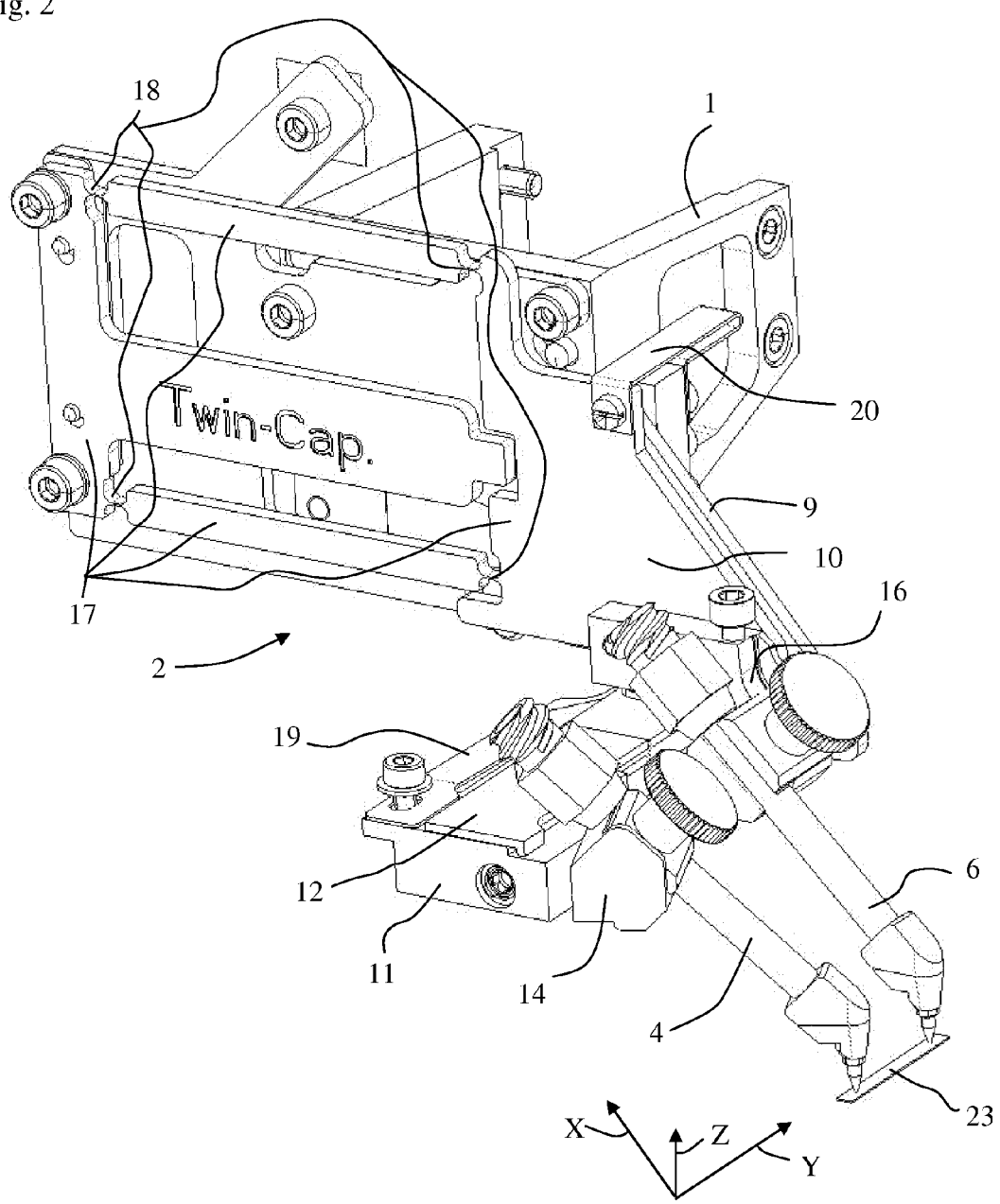
FIG. 2 shows the device in another perspective.

FIG. 1 shows a perspective view of a device in accordance with the invention for applying adhesive to a substrate insofar as it is required for the understanding of the invention. The device comprises a writing head 1 with a retainer 2, to which a first adhesive container 3 with a first dispensing nozzle 4 and a second adhesive container 5 with a second dispensing nozzle 6 can be fixed. In addition to FIG. 1, FIG. 2 shows the device in accordance with the invention from a different perspective. In FIG. 2, the adhesive containers and parts of the retainer 2 were omitted so that other parts of the device can be recognized with more clarity. The device comprises at least three drives (not shown) in order to move the writing head 1 in three spatial directions X, Y and Z, wherein the directions X and Y extend parallel to the surface of the substrate and the Z direction perpendicularly thereto. The adhesive containers and the respective dispensing nozzle are detachably connected to each other. The retainer 2 comprises a first bracket 7 for fixing the first adhesive container 3, a second bracket 8 for fixing the second adhesive container 5, a first fixed frame 9, a second movable frame 10, a table 11 with a plate 12 and, optionally, a guide 13. The table 11 is fixed to the fixed frame 9, wherein the table 11 and the plate 12 are aligned in a plane-parallel way in respect to a support surface on which the substrates are placed. A first fastening part 14 is fixed to the plate 12, which fastening part is configured to fix the dispensing nozzle 4. The first fastening part 14 can be fastened displaceably in a first direction (the X direction in this case) to the plate 12 and the plates 12 can be fastened displaceably in a second direction (the Y direction in this case) to the table 11, so that the XY position of the tip of the first dispensing nozzle 4 is adjustable. A second fastening part 16 is fixed to the second frame 10, which is set up to fix the second dispensing nozzle 6. The second frame 10 is movably arranged in such a way that the second fastening part 16 is displaceable with respect to the first frame 9 and the plate 12 substantially in the Z direction. The second frame 10 consists of four struts 17 for example, which are each connected via a flexure hinge 18 to each other. The guide 13 is formed in this example by an elongated metallic strip 19, the one end of which is fixed to the plate 12 and the other end of which is fixed to the second fastening part 16, and by a leaf spring 20, the one end of which is fixed to the frame 10 and the other end of which is fixed to the writing head 1. The strip 19 and the leaf spring 20 ensure that the strut 17 of the movable frame 10 to which the second fastening part 16 is fixed can perform up and down movements, i.e. movements in the Z direction, while movements of the frame 10 in the X direction and the Y direction are not possible. As a result, fluttering of the second fastening part 16 is prevented during abrupt movements of the writing head 1. The tip of the first dispensing nozzle 4 is thus fixed to the writing head 1, whereas the tip of the second dispensing nozzle 6 is movable in a direction extending substantially perpendicularly to the surface of the substrate, which in this case is the Z direction. A pin 22 which is displaceable in the Y direction by means of an actuator 21 is fixed to the writing head 1, the object of which will be described below in closer detail. The actuator 21 and the pin 22 are not visible in FIGS. 1 and 2, but in FIGS. 3 and 4. FIGS. 1 to 4 additionally show a small plate 23 which does not belong to the device and which illustrates the plane of the substrate surface.

The device further comprises either a first pneumatic system for supplying the first adhesive container 3 with a pressure pulse and a second pneumatic system for supplying the second adhesive container 5 with a pressure pulse, or a single pneumatic system and a valve which allow supplying both adhesive containers 3 and 5 simultaneously with a pressure pulse in a first valve position and only supplying the first dispensing nozzle 4 with a pressure pulse in a second valve position. The second adhesive container 5 is preferably supplied with negative pressure in the second valve position.

Figure 3:
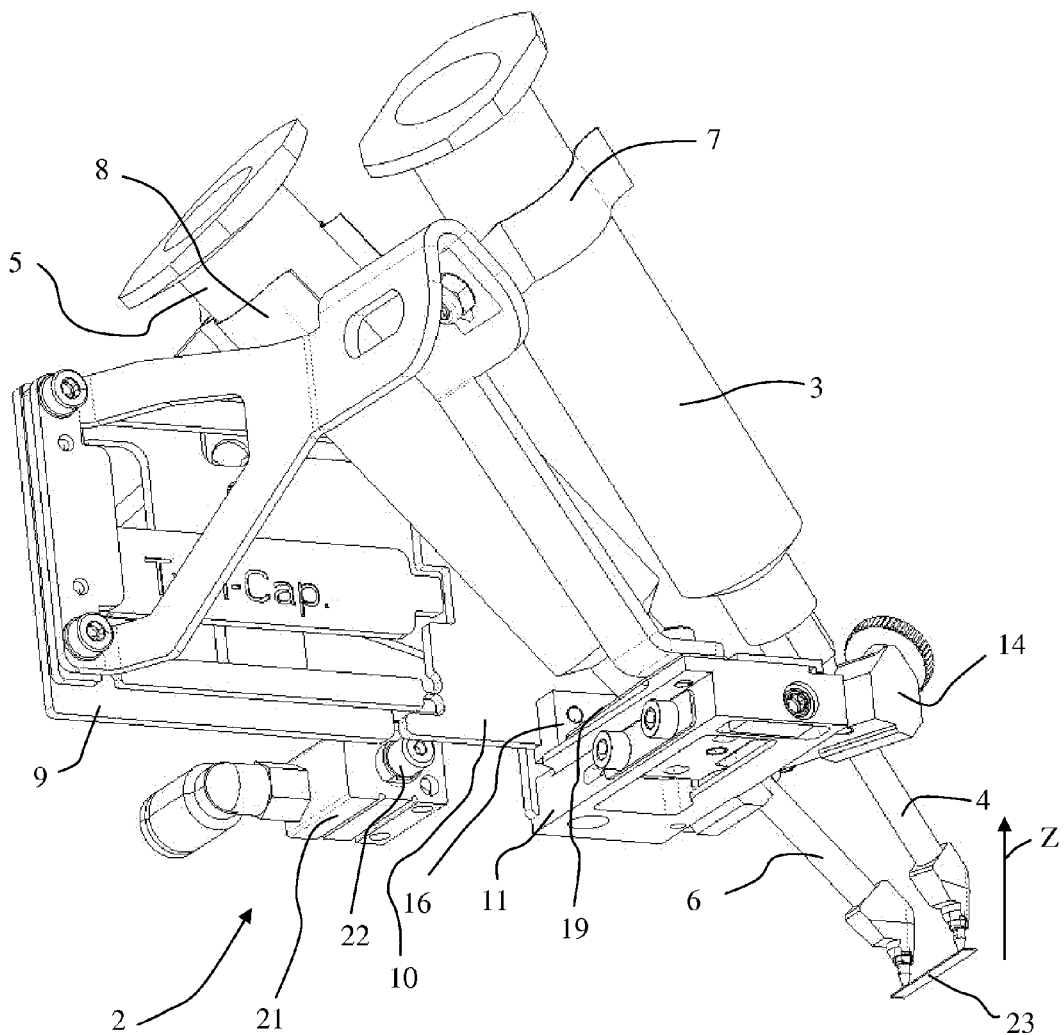
FIGS. 3 and 4 show the device in two different operating modes.
Figure 4:
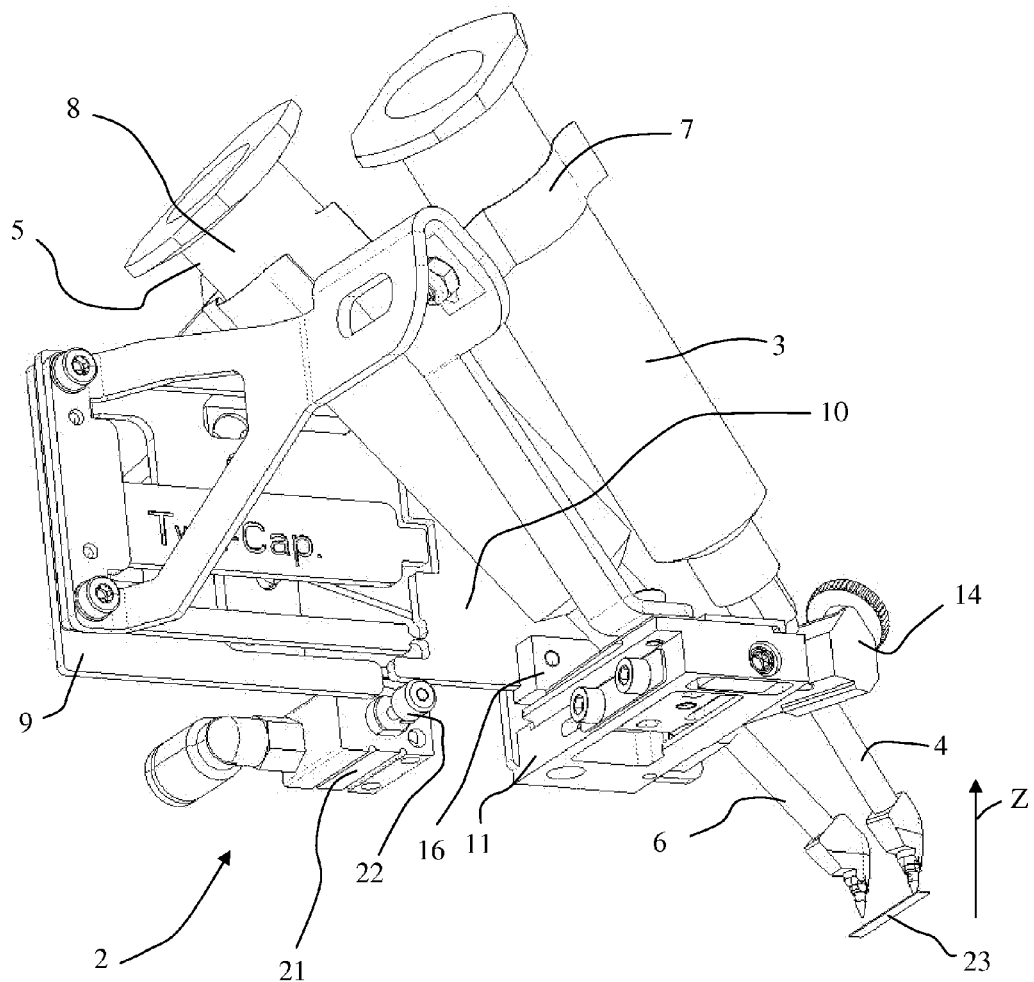

The device in accordance with the invention allows writing two adhesive patterns on two adjacent substrate places simultaneously with the two dispensing nozzles 4 and 6 in a first mode, or writing an adhesive pattern on one substrate place only with a single dispensing nozzle (namely the first dispensing nozzle 4) in a second mode. For this purpose, the pin 22, the movable frame 10, the motorised Z axis of the writing head 1 and the pneumatic system (or the pneumatic systems) cooperate in the manner as described below. FIG. 3 shows the device in mode 1, and FIG. 4 shows the device in mode 2. The writing head 1 is lifted at first to a Z position $z_1$ during the change from one mode to the other mode.

Subsequently, for the operation in mode 1,
the pin 22 is moved to a retracted position;
the writing head is lowered to a predetermined Z position $z_2$ with $z_2 < z_1$, which corresponds to the desired working altitude of the tips of the dispensing nozzles 4 and 6 above the substrate;
or in mode 2
the pin 22 is moved to an extended position;
the writing head 1 is lowered to the predetermined Z position $z_2$.

When the writing head 1 is lowered in mode 2, the movable frame 10 comes to rest on the pin 22 before it has reached the Z position $z_2$. When the writing head 1 is then situated at the Z position $z_2$, the tip of the first dispensing nozzle 4 is at the desired working altitude above the substrate, whereas the tip of the second dispensing nozzle 6 is situated at a higher altitude.

In mode 1, the writing head 1 is moved along a predetermined path, and the two adhesive containers 3 and 5 are supplied with a pressure pulse simultaneously and synchronously, whereas in mode 2 the writing head 1 is moved along a predetermined path and only the first adhesive container 3 is supplied with a pressure pulse.

The device can be extended easily in order to write several adhesive patterns 2 on adjacent substrate places with three, four or more adhesive containers and dispensing nozzles simultaneously in the first mode, and to write only one adhesive pattern in the second mode with a single dispensing nozzle.

The invention was described by reference to an embodiment. It is obvious to the person skilled in the art that the mechanical configuration of the device can also be realized in other ways in order to enable the operation of the device in the two operating modes.

The invention claimed is:

1. A device for dispensing adhesive on a substrate, comprising:
a writing head movable in three spatial directions, the three spatial directions including two directions extending parallel to a surface of the substrate and one direction extending substantially perpendicularly to the surface of the substrate, the writing head configured to receive a first dispensing nozzle and at least one second dispensing nozzle each having a tip so that the tip of the first dispensing nozzle is fixed and the tip of the at least one second dispensing nozzle is movable substantially in the direction extending substantially perpendicularly to the surface of the substrate, and an actuator with a pin, the pin configured to be fixed in one of a retracted state wherein the pin is retracted and an extended state wherein the pin is extended, wherein the device is configured to be operated in a first operating mode and a second operating mode and is configured to perform the following steps when changing between the first operating mode and the second operating mode:
lifting the writing head,
changing the state of the pin between the retracted state and the extended state, and
lowering the writing head to a predetermined working altitude, wherein the tips of the dispensing nozzles reach a substantially similar altitude above the substrate when the pin is in the retracted state, and wherein the tip of the at least one second dispensing nozzle reaches a higher altitude above the substrate than the tip of the first dispensing nozzle when the pin is in the extended state.

2. The device of claim 1, wherein:
the device further comprises four struts which are connected to each other via flexure hinges,
the at least one second dispensing nozzle is fixed to one of the struts,
the flexure hinges are configured to enable a movement of the tip of the at least one second dispensing nozzle in the direction which extends substantially perpendicularly to the surface of the substrate, and a guide is configured to prevent a movement of the strut to which the at least one second dispensing nozzle is fixed in the two directions extending parallel to the surface of the substrate.

\* \* \* \* \*